United States Patent
Mun et al.

(10) Patent No.: US 12,408,373 B1
(45) Date of Patent: Sep. 2, 2025

(54) DEVICE WITH THREE DIMENSIONAL CHANNEL

(71) Applicant: GlobalFoundries Singapore Pte. Ltd., Singapore (SG)

(72) Inventors: Bong Woong Mun, Singapore (SG); Khon Cho, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 18/649,301

(22) Filed: Apr. 29, 2024

(51) Int. Cl.
*H10D 30/66* (2025.01)
*H10D 30/01* (2025.01)
*H10D 62/10* (2025.01)
*H10D 64/27* (2025.01)

(52) U.S. Cl.
CPC ....... *H10D 30/663* (2025.01); *H10D 30/0291* (2025.01); *H10D 62/116* (2025.01); *H10D 64/518* (2025.01)

(58) Field of Classification Search
CPC ............. H01L 29/7809; H01L 29/0653; H01L 29/42376; H01L 29/66712; H01L 29/66681–66704; H01L 29/7816–7826; H01L 21/823481; H01L 29/66568–66659; H01L 21/76224–76237; H01L 21/823878; H01L 29/7813; H01L 29/7825; H01L 29/66734; H10D 30/663; H10D 30/0291; H10D 62/116; H10D 64/518; H10D 30/0281–0289; H10D 30/65–659; H10D 84/0151; H10D 84/0188
See application file for complete search history.

(56) References Cited

U.S. PATENT DOCUMENTS

| | | | |
|---|---|---|---|
| 9,099,434 B2 | 8/2015 | Zhang et al. | |
| 9,570,606 B2 | 2/2017 | Li | |
| 11,257,949 B2 | 2/2022 | Mun et al. | |
| 2013/0277741 A1 | 10/2013 | Guowei et al. | |
| 2016/0111488 A1* | 4/2016 | Lu | H10D 64/117 438/270 |
| 2016/0149030 A1* | 5/2016 | Kim | H10D 62/158 257/401 |
| 2019/0305129 A1* | 10/2019 | Uda | H10D 62/151 |
| 2022/0181444 A1 | 6/2022 | Toner et al. | |

(Continued)

FOREIGN PATENT DOCUMENTS

CN 115020497 A 9/2022

OTHER PUBLICATIONS

Yuanzheng Zhu et al., "Folded Gate LDMOS Transistor With Low On-Resistance and High Transconductance", in IEEE Transactions on Electron Devices, vol. 48, No. 12, pp. 2917-2928, Dec. 2001, 12 pages.

(Continued)

*Primary Examiner* — Shahed Ahmed
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to devices with a three dimensional channel and methods of manufacture. The structure includes: a drift region within a semiconductor substrate; a shallow trench isolation structure within the drift region; and a gate structure within the shallow trench isolation structure and extending to an upper surface of the semiconductor substrate adjacent to the drift region.

20 Claims, 8 Drawing Sheets

(56) References Cited

U.S. PATENT DOCUMENTS

2023/0275149 A1\* 8/2023 Wu ...................... H10D 30/658
　　　　　　　　　　　　　　　　　　　　　　　　　257/343
2024/0030341 A1\* 1/2024 Pandey .............. H10D 30/0289

OTHER PUBLICATIONS

Jin Wei et al., "High-Speed Power MOSFET with Low Reverse Transfer Capacitance Using a Trench/Planar Gate Architecture", 2017 29th International Symposium on Power Semiconductor Devices and IC's (ISPSD), Sapporo, Japan, 2017, pp. 331-334, doi: 10.23919/ISPSD.2017.7988956, 4 pages.

Tobias Erlbacher et al., "Reduced on Resistance in LDMOS Devices by Integrating Trench Gates Into Planar Technology", in IEEE Electron Device Letters, vol. 31, No. 5, pp. 464-466, May 2010, doi: 10.1109/LED.2010.2043049, 3 pages.

R. Gay et al., "A Novel Trench-Based Triple Gate Transistor With Enhanced Driving Capability", in IEEE Electron Device Letters, vol. 42, No. 6, pp. 832-834, Jun. 2021, doi: 10.1109/LED.2021.3076609, 3 pages.

M. Jagadesh Kumar et al., "Extended-p+ Stepped Gate LDMOS for Improved Performance," in IEEE Transactions on Electron Devices, vol. 57, No. 7, pp. 1719-1724, Jul. 2010, doi: 10.1109/TED.2010.2049209, 19 pages.

Non-Final Rejection Office Action dated Sep. 25, 2024 in U.S. Appl. No. 18/642,052, 16 pages.

Response to Restriction Requirement dated Aug. 30, 2024 in U.S. Appl. No. 18/642,052, 1 page.

\* cited by examiner

DEVICE WITH THREE DIMENSIONAL CHANNEL

BACKGROUND

The present disclosure relates to semiconductor structures and, more particularly, to devices with a three dimensional channel and methods of manufacture.

A laterally-diffused metal-oxide semiconductor (LDMOS) is a planar double-diffused MOSFET (metal-oxide-semiconductor field-effect transistor) used in amplifiers, including microwave power amplifiers, RF power amplifiers and audio power amplifiers. A silicon-based RF LDMOS (radio-frequency LDMOS) is a widely used RF power amplifier in mobile networks, enabling the majority of the world's cellular voice and data traffic.

SUMMARY

In an aspect of the disclosure, a structure comprises: a drift region within a semiconductor substrate; a shallow trench isolation structure within the drift region; and a gate structure within the shallow trench isolation structure and extending to an upper surface of the semiconductor substrate adjacent to the drift region.

In an aspect of the disclosure, a structure comprises: a semiconductor substrate comprising a drift region and diffusion regions; a shallow trench isolation structure within the drift region; and a gate structure extending with the shallow trench isolation structure and comprising a three dimensional channel region.

In an aspect of the disclosure, a method comprises: forming a drift region within a semiconductor substrate; forming a shallow trench isolation structure within the drift region; and forming a gate structure within the shallow trench isolation structure and extending to an upper surface of the semiconductor substrate adjacent to the drift region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to devices with a three dimensional (3D) channel and methods of manufacture. More specifically, the present disclosure comprises a laterally diffused metal-oxide semiconductor (LDMOS) device with a 3D channel. In embodiments, the LDMOS includes a drift region adjacent to a channel region, and a gate structure above the channel region which extends in a shallow trench isolation region within the drift region. Advantageously, the use of a 3D channel offers a high-performance LDMOS device.

The structure of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
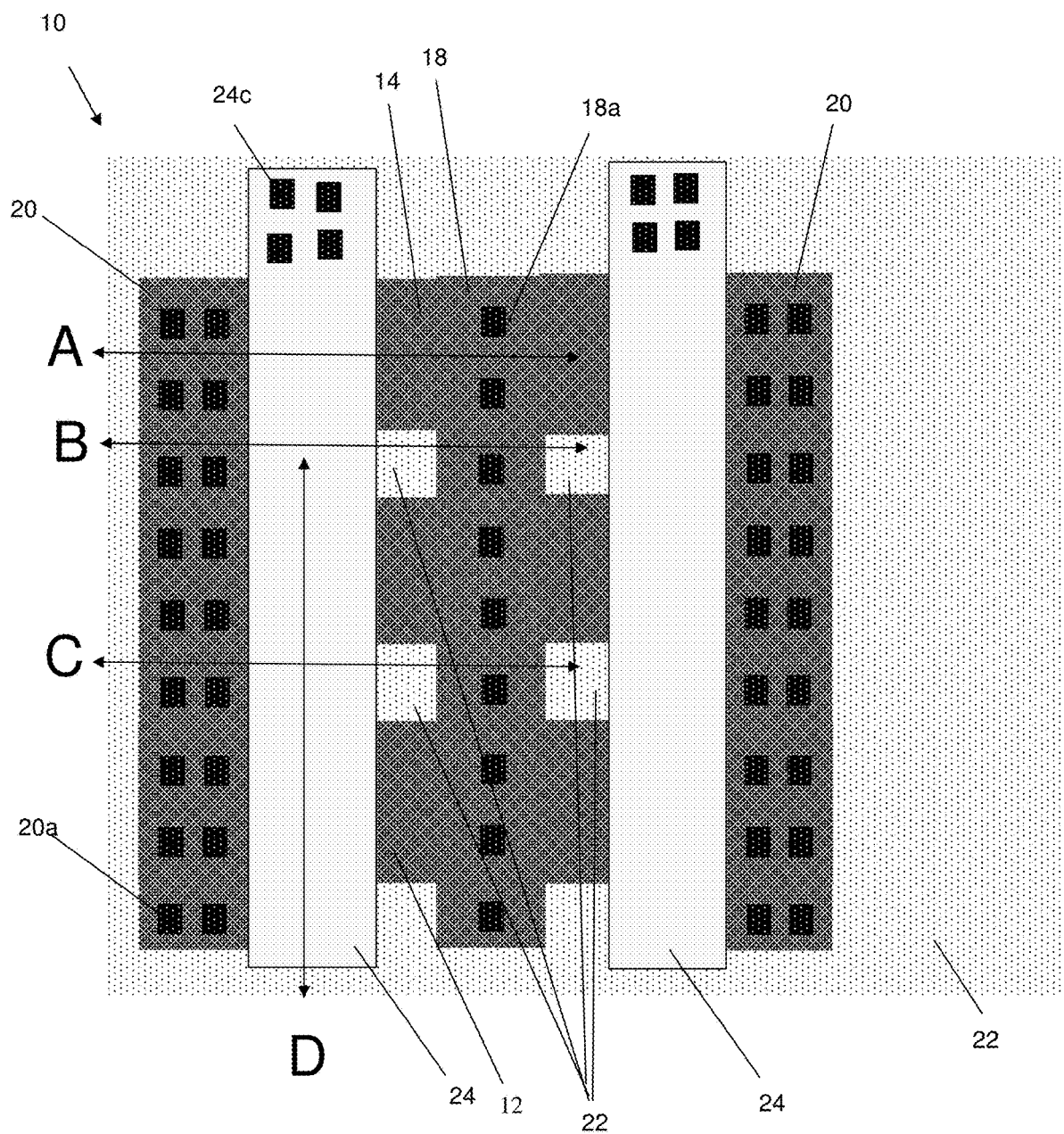
FIG. 1 shows a top view of a device in accordance with aspects of the present disclosure.
Figure 1A:
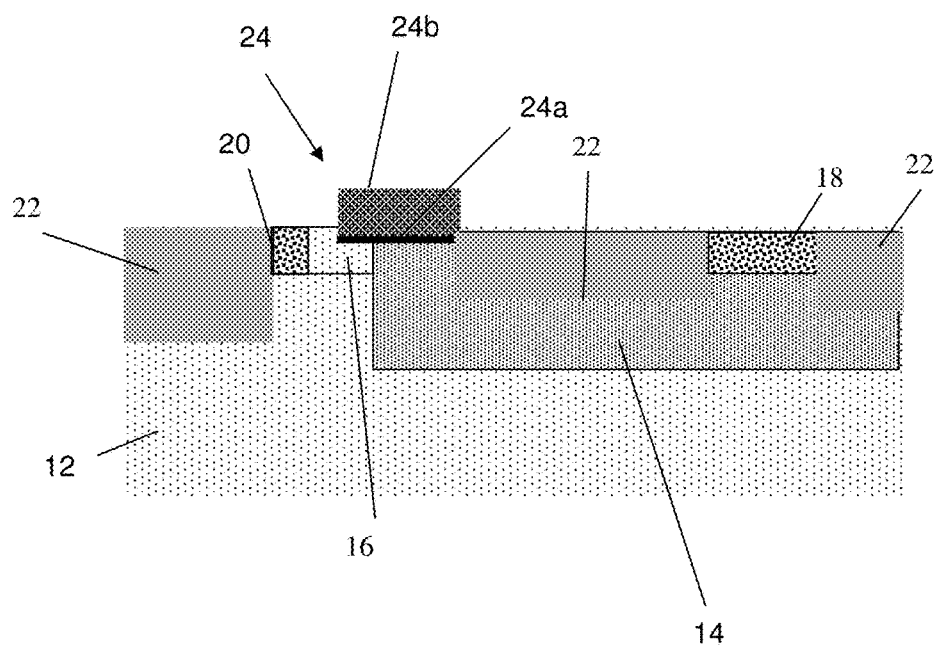
FIG. 1A shows a cross-sectional view of the device of FIG. 1 along line A.
Figure 1B:
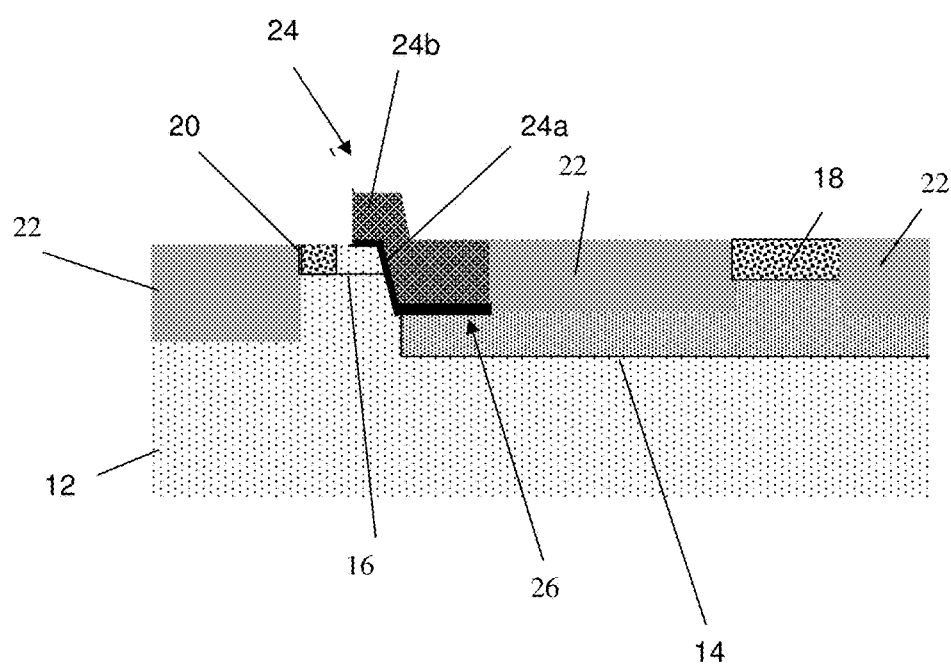
FIG. 1B shows a cross-sectional view of the device of FIG. 1 along line B.
Figure 1C:
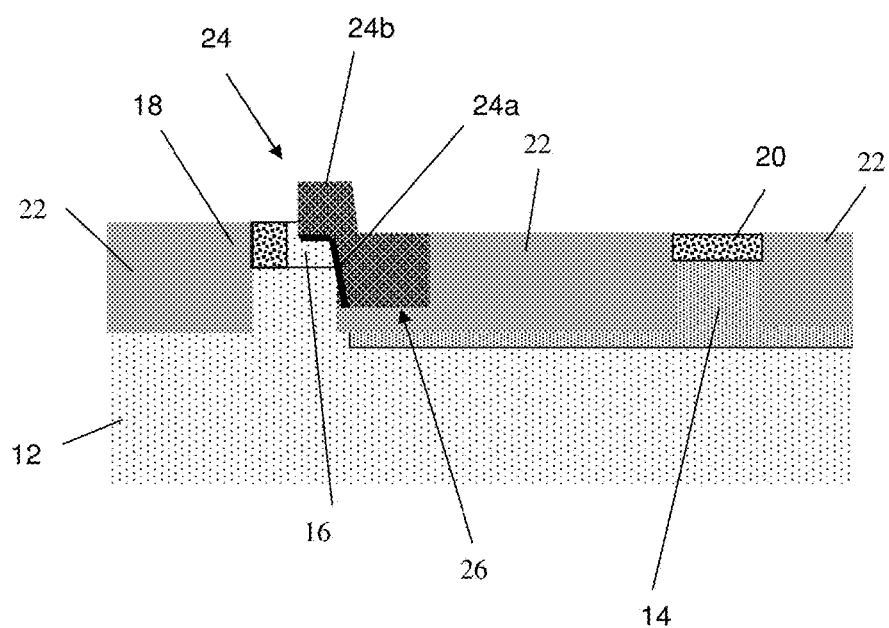
FIG. 1C shows a cross-sectional view of the device of FIG. 1 along line C.
Figure 1D:
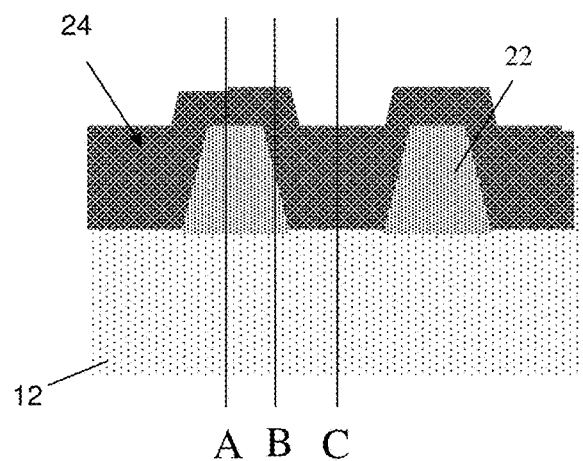
FIG. 1D shows a cross-sectional view of the device of FIG. 1 along line D.

FIGS. 1, 1A, 1B, 1C and 1D show different views of a device in accordance with aspects of the present disclosure. In embodiments, the device 10 is an LDMOS with a 3D channel region. More specifically, FIG. 1 shows a top view of the device 10, FIG. 1A shows a cross-sectional view of the device 10 along line A, FIG. 1B shows a cross-sectional view of the device 10 along line B, FIG. 1C shows a cross-sectional view of the device 10 along line C, and FIG. 1D shows a cross-sectional view of the device 10 along line D. It should be understood by one of ordinary skill in the art that FIGS. 1A, 1B and 1C are also different cross-sectional views of the device 10 along respective lines A, B and C shown in FIG. 1D.

Referring to FIGS. 1, 1A, 1B, 1C and 1D, the device 10 includes active regions in a semiconductor substrate 12. In embodiments, the semiconductor substrate 12 may be composed of any suitable material including, but not limited to, Si, SiGe, SiGeC, SiC, GaAs, InAs, InP, and other III/V or II/VI compound semiconductors. The semiconductor substrate 12 may be representative of a bulk material or semiconductor-on-insulator material (SOI) as is known in the art such that no further explanation is required for a complete understanding of the present disclosure. In embodiments, the semiconductor substrate 12 may comprise any suitable crystallographic orientation (e.g., a <100>, <110>, <111>, or <001> crystallographic orientation). Also, in preferred embodiments, the semiconductor substrate 12 may be p+ doped Si material.

As further shown in FIGS. 1-1C, the semiconductor substrate 12 may include active regions, e.g., drift region 14 and a body contact 16. The drift region 14 includes a drain diffusion region 18 and the body contact 16 includes a source diffusion region 20. The drift region 14 may be an N-well implant region and the body contact 16 may be a P-well implant region (or vice versa depending on the device characteristics, e.g., NMOS or PMOS device). As described in more detail with respect to FIGS. 3A and 3E, the drift region 14, body contact 16, drain region 18 and source region 20 may be formed by a conventional ion implantation process that introduces a concentration of n-type dopant (e.g., arsenic) or p-type dopant (e.g., boron) into the semiconductor substrate 12.

As shown in FIG. 1, for example, the diffusion region 18 may include one or more contacts 18a, e.g., via interconnect structures. Similarly, the diffusion region 20 may include one or more contacts 20a, e.g., via interconnect structures. In embodiments, the contacts 18a, 20a may be any metal or metal alloy used in semiconductor devices. For example, the contacts 18a, 20a may be tungsten, copper, aluminum, TaN, TiN, etc., formed by conventional lithography, etching and deposition methods as described herein.

Referring to FIGS. 1-1D, shallow trench isolation structures 22 may be provided in the semiconductor substrate 12. In embodiments, the shallow trench isolation structures 22 may be adjacent to and isolate the body contact 16 and the diffusion regions 18, 20. Moreover, the shallow trench isolation 22 may be provided in the drift region 16, adjacent to a gate structure 24. In more specific embodiments and as shown in FIGS. 1-1C, the shallow trench isolation structure 22 in the drift region 14 may be provided between the diffusion region 18 and the diffusion region 20. As described with respect to FIG. 3A, the shallow trench isolation structures 22 may be formed by conventional lithography, etching and deposition methods known to those of skill in the art.

FIGS. 1-1D further show a gate structure 24. The gate structure 24 may be an LDMOS, as an example. The gate structure 24 includes a gate dielectric material 24a and a gate electrode 24b. The gate structure 24 can also include sidewall spacers fabricated using conventional deposition processes, followed by an anisotropic etching process as shown in FIG. 3E. The sidewall spacers may be, for example, oxide or nitride or combinations thereof, as shown and described in more detail with respect to FIG. 3E. Gate contacts 24c may be provided on the gate electrode 24b as is known in the art. FIGS. 3D and 3E further describe the fabrication processes for forming the gate structure 24.

In embodiments, the gate dielectric material 24a may be a low-k dielectric material or a high-k gate dielectric material, e.g., $HfO_2Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The low-k gate dielectric material may be $SiO_2$, for example. The gate electrode 24b may be a polysilicon material or metal material. Examples of metal materials may include Ti, TiAlC, Al, TiAl, TaN, TiN, TIC, Co, TaC, HfTi, TiSi, TaSi, etc. The workfunction materials and gate dielectric material may be formed by chemical vapor deposition (CVD), physical vapor deposition (PVD) including sputtering, atomic layer deposition (ALD) or other suitable method.

Prior to forming the contacts 18a, 20a on the diffusion regions 18, 20 and the gate contacts 24 on the gate structure 24, a silicide process may be performed on the diffusion regions 18, 20 and the gate structure 24. As should be understood by those of skill in the art, the silicide process begins with deposition of a thin transition metal layer, e.g., nickel, cobalt or titanium, over fully formed and patterned semiconductor devices (e.g., diffusion regions 18, 20 and gate structure 24). After deposition of the material, the structure is heated allowing the transition metal to react with exposed silicon (or other semiconductor material as described herein) in the active regions of the semiconductor device (e.g., diffusion regions 18, 20 and gate structure 24) forming a low-resistance transition metal silicide. Following the reaction, any remaining transition metal is removed by chemical etching, leaving silicide contacts in the active regions of the device. It should be understood by those of skill in the art that silicide contacts will not be required on the device when a gate structure 24 is composed of a metal material.

As shown in FIG. 1A, the gate structure 24 is provided partly over the shallow trench isolation structure 22 and the body contact 16. In more specific embodiments, the gate structure 24 in this cross-sectional view is planar within the drift region 14 and between the diffusion region 20 and the diffusion region 18.

As shown in FIG. 1B, the gate structure 24 extends in a trench 26 within the shallow trench isolation structure 22. The gate structure 24 extends to the underlying semiconductor substrate 12 and, more specifically, to a surface of the drift region 14 (e.g., contacts the drift region 14). As shown in this view, the gate dielectric material 24a may line the sidewall and bottom of the trench 26 and extends to the upper surface of the semiconductor substrate 12. More specifically, the gate dielectric material 24a may line a surface of the drift region 14, which was exposed by the trench 26 formed in the shallow trench isolation structure 22. In this view, the channel region is a sloped channel region.

As shown in the cross-sectional view of FIG. 1C, the trench structure 26 extends partly through a depth of the shallow trench isolation structure 22 within the drift region 14. In this cross-sectional view, the gate dielectric material 24 will line the sidewall of the trench 26 and the gate electrode 24b will fill the remaining portion of the trench 26. The gate dielectric material 24a and the gate electrode 24b will extend to the upper surface of the semiconductor substrate 12 on a side of the drift region 14. The gate electrode 24b will be separated from the underlying semiconductor substrate 12, e.g., drift region 14, by a bottom portion of the shallow trench isolation structure 22 within the drift region 14. In this way, a vertical channel region may be formed in the shallow trench isolation structure 22.

As shown in FIG. 1D, the gate structure 24 is shown to extend over the active regions of the structure over the semiconductor substrate 12 and the shallow trench isolation structures 22.

Figure 2:
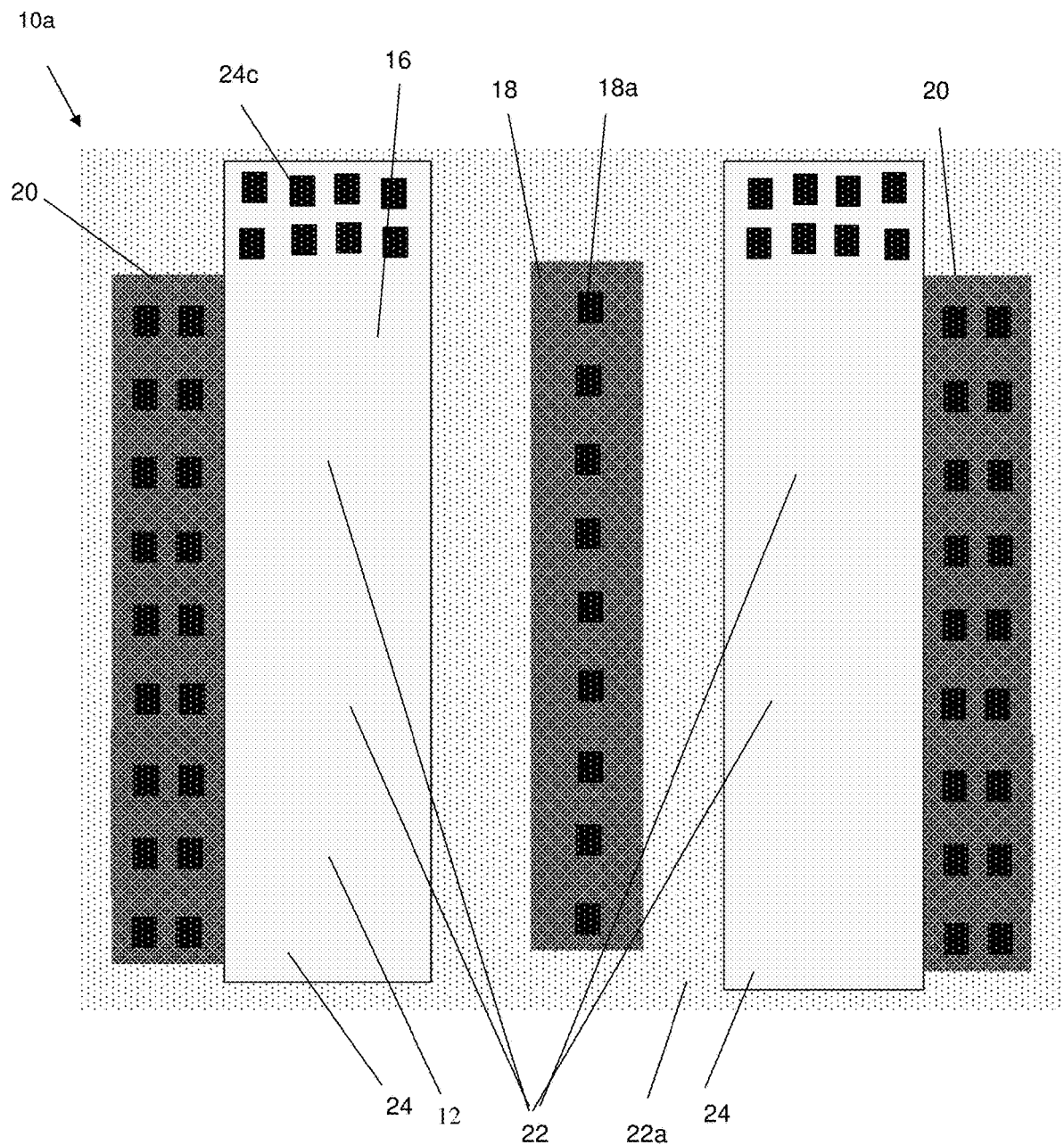
FIG. 2 shows a top view of a device in accordance with additional aspects of the present disclosure.

FIG. 2 shows a top view of a device in accordance with aspects of the present disclosure. In the device 10a of FIG. 2, a shallow trench isolation structure 22a separates the diffusion region 18 from the gate structure 14 and the diffusion region 20. The remaining structures of the device 10a are similar to the device 10 of FIG. 1 such that no explanation is required herein. For example, the device 10a of FIG. 2 exhibits the sloped channel region and the vertical channel region.

FIGS. 3A-3E show a process flow to fabricate the device shown in FIG. 1 in a first cross-sectional view in accordance with aspects of the present disclosure. This flow is representative of the cross-sectional view of FIG. 1C, for example.

Figure 3A:
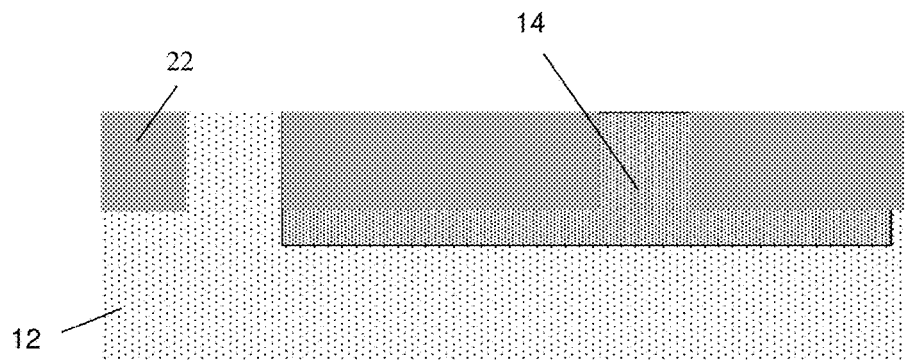
FIGS. 3A-3E show a process flow to fabricate the device shown in FIG. 1 in a first cross-sectional view in accordance with aspects of the present disclosure.

In FIG. 3A, for example, the drift region 14 may be formed in the semiconductor substrate 14. In embodiments, the drift region 14 (e.g., well) may be formed by introducing a dopant by, for example, ion implantation in the semiconductor substrate 12. In embodiments, a patterned implantation mask may be used to define selected areas exposed for the implantation. The implantation mask used to select the exposed area for forming drift region 14 is stripped after implantation. The implantation mask may include a layer of a light-sensitive material, such as an organic photoresist, applied by a spin coating process, pre-baked, exposed to light projected through a photomask, baked after exposure, and developed with a chemical developer. The implantation mask has a thickness and stopping power sufficient to block masked areas against receiving a dose of the implanted ions. Depending on the device characteristics, for a P-well, p-type dopants may be, e.g., Boron (B), and for an N-well, n-type dopants may be, e.g., Arsenic (As), Phosphorus (P) and Antimony (Sb), among other suitable examples.

The shallow trench isolation structures 22 may be formed in the drift region 14 and adjacent to the drift region 14 by conventional lithography, etching and deposition methods known to those of skill in the art. For example, a resist formed over the semiconductor substrate 12 is exposed to energy (light) and developed utilizing a conventional resist developer to form a pattern (opening). An etching process with a selective chemistry, e.g., reactive ion etching (RIE), will be used to transfer the pattern from the patterned photoresist layer to semiconductor substrate 12 to form one or more trenches in the semiconductor substrate 12 through the openings of the resist. Following the resist removal by a conventional oxygen ashing process or other known stripants, the insulator material, e.g., oxide material, can be deposited by any conventional deposition processes, e.g., chemical vapor deposition (CVD) processes. Any residual material on the surface of the semiconductor substrate 12 can be removed by conventional chemical mechanical polishing (CMP) processes.

Figure 3B:
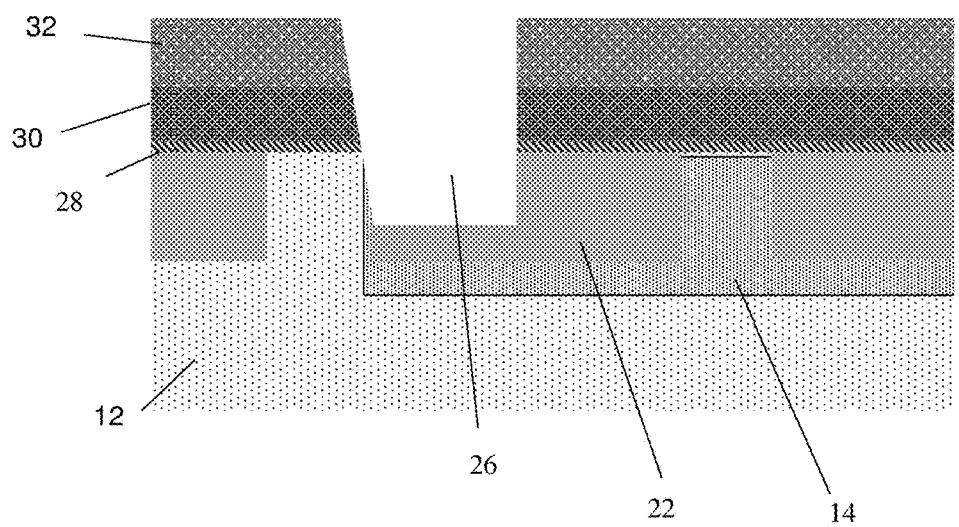

In FIG. 3B, the trench 26 may be formed in the shallow trench isolation structure 22. In this cross-sectional view, the trench 26 extends partially through a full depth of the shallow trench isolation structure 22 in the drift region 14 (as shown in FIG. 1C). A conventional etching process, e.g., RIE using a HF solution, may be used to form the trench 26 in the shallow trench isolation structure 22 within the drift region 14.

Figure 3C:
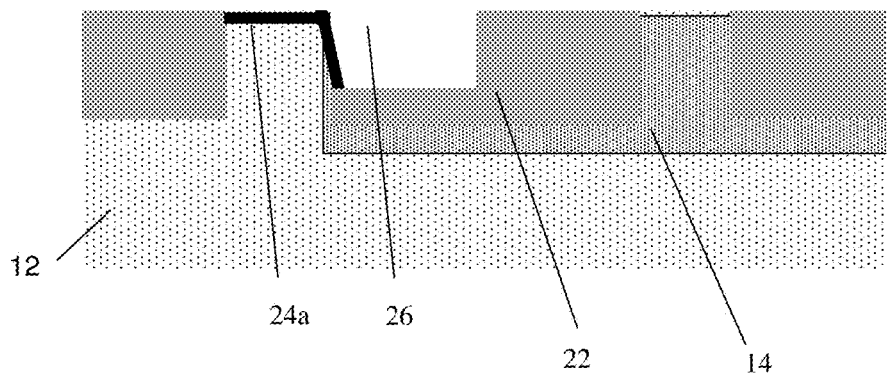
Figure 3D:
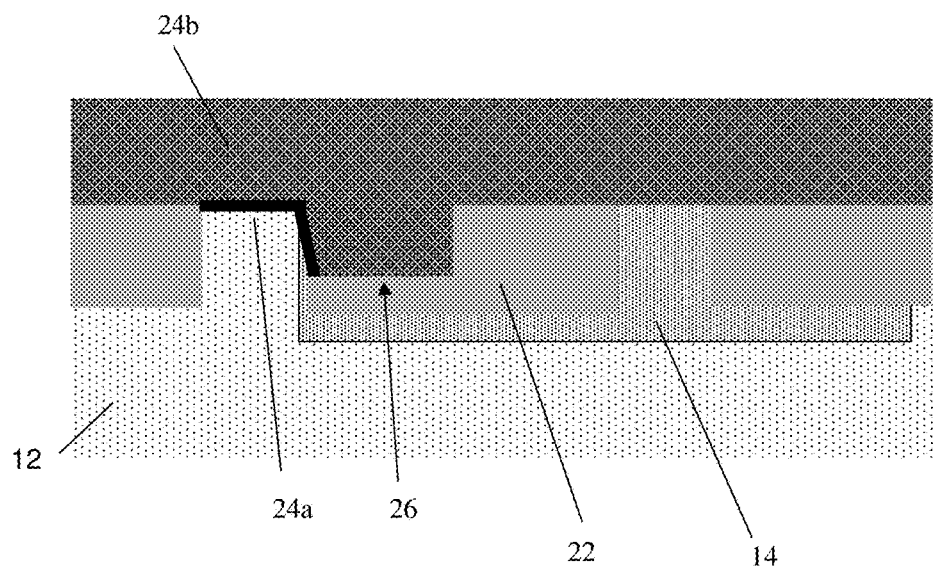
Figure 3E:
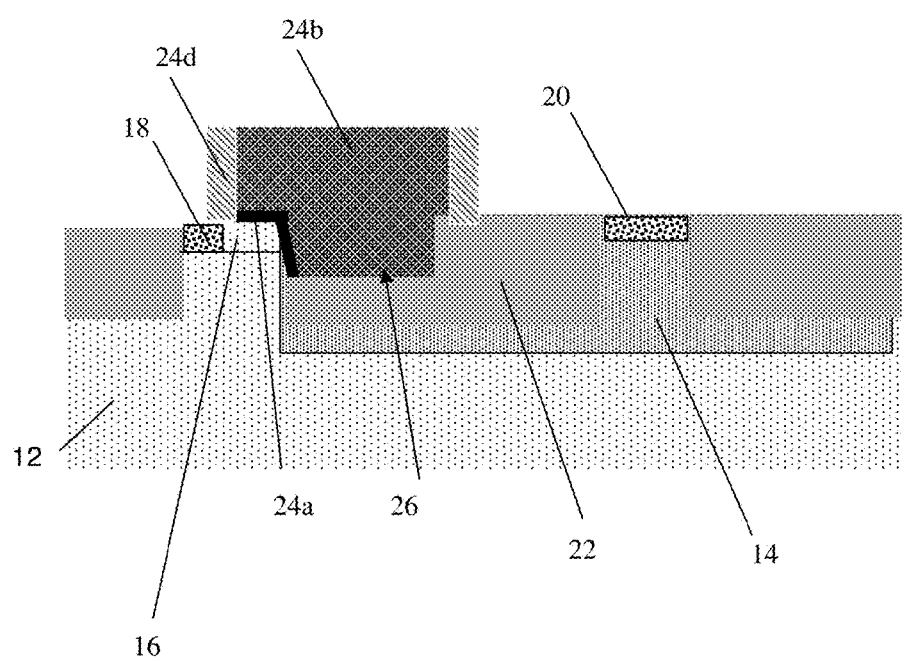

Prior to forming the trench 26, insulator layers 28, 30 may be formed over the shallow trench isolation structures 22 and exposed portions of the semiconductor substrate 12. In embodiments, the insulator layers 28, 30 may be an oxide layer 28 and a nitride layer 30 as examples. A masking material 32 may also be provided over the insulator layer 30. In embodiments, the masking material 32 may be any combination of masking materials used in lithography processes as is known in the art. The insulator layers 28, 30 may be formed by a conventional deposition process such as CVD. A conventional etching process, e.g., RIE using a HF solution, may be used to form the trench 26 in the shallow trench isolation structure 22 within the drift region 14. In FIG. 3C, a gate dielectric material 24a may be formed on a sidewall of the trench 26 and a surface of the semiconductor substrate 12, adjacent to the drift region 14. The gate dielectric material 24a may be a low-k dielectric material or a high-k dielectric material as already described herein. The gate dielectric material 24a may be deposited using any known deposition method such as atomic layer deposition (ALD) or a plasma enhanced CVD (PECVD) process, amongst other deposition methods known to those of skill in the art such that no further explanation is required for a complete understanding of the present disclosure. The gate dielectric material 24a may be patterned using conventional lithography and etching processes as described herein, resulting in the gate dielectric material 24a on a sidewall of the trench 26 (forming a sloped gate channel) and over the semiconductor substrate 12, adjacent to the drift region 16.

As further shown in FIG. 3D, a gate electrode material 24b may be blanket deposited over the structure. The blanket deposition may be a CVD as an example. This will result in at least the gate electrode material 24b being formed within the trench 26 and over the gate dielectric material 24a. In embodiments, the gate electrode material 24b may be a polysilicon material; although metal materials are also contemplated herein.

In FIG. 3E, the gate electrode material 24b may be patterned using conventional lithography and etching processes. Following the formation of the patterned gate electrode 24b, a sidewall spacer 24d may be formed on a sidewall of the gate electrode 24b and gate dielectric material 24a. In embodiments, the sidewall spacer 24 may be oxide, nitride or a combination thereof, deposited by a conventional deposition method, e.g., CVD. Following the deposition of the sidewall spacer material, an anisotropic etching process may be performed to pattern the sidewall spacers 24d.

The gate body 16, the drain region 18 and the source region 20 may be formed by conventional ion implantation processes as already described herein using separate masks and dopant types such that no further explanation is required for one of ordinary skill in the art to practice the invention. The contacts 24a, 18a, 20a to the respective gate structure 24, drain region 18 and source region 20 are described in detail with respect to FIGS. 1-1D. The contacts 24a, 18a, 20a may be deposited within trenches formed in interlevel dielectric material as is known in the art.

FIGS. 4A-4E show a second process flow to fabricate the device shown in FIG. 1 in a second cross-sectional view. This flow is representative of the cross sectional view of FIG. 1B, for example.

Figure 4A:
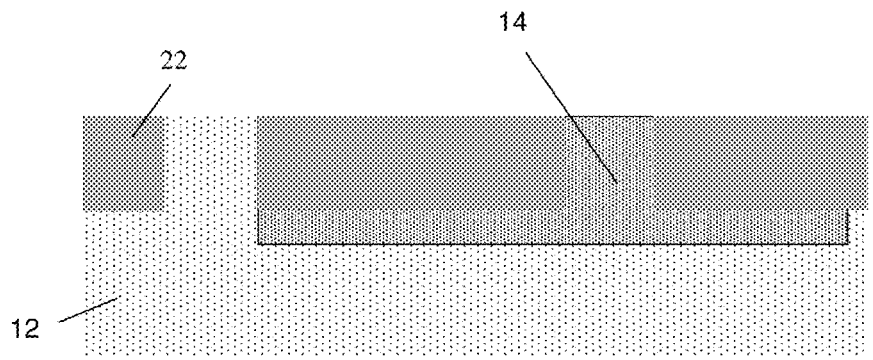
FIGS. 4A-4E show the process flow to fabricate the device shown in FIG. 1 in a second cross-sectional view in accordance with aspects of the present disclosure.
Figure 4B:
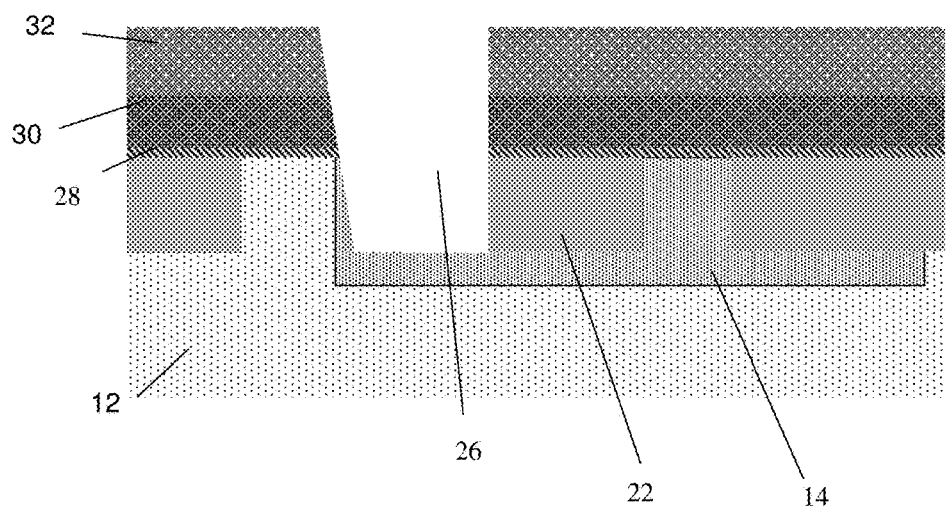

In FIG. 4A, for example, the drift region 14 and the shallow trench isolation structures 22 may be formed in the semiconductor substrate 14 as already described with respect to FIG. 3A. In FIG. 4B, the trench 26 may be formed in the shallow trench isolation structure 22. In this cross-sectional view, the trench 26 extends the full depth of the shallow trench isolation structure 22 to expose the underlying the drift region 16 (as shown in FIG. 1B). As already described, a conventional etching process, e.g., RIE using a HF solution, may be used to form the trench 26 in the shallow trench isolation structure 22 within the drift region 14.

Figure 4C:
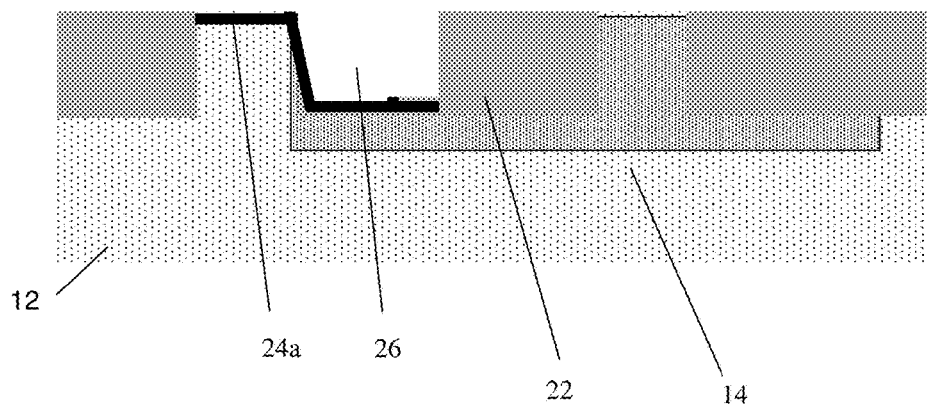

In FIG. 4C, a gate dielectric material 24a may be formed on a sidewall and bottom of the trench 26 in the shallow trench isolation structure 22 within the drift region 16. The gate dielectric material 24a will also extend onto a surface of the semiconductor substrate 12, adjacent to the drift region 14. As previously described, the gate dielectric material 24a may be a low-k dielectric material or a high-k dielectric material formed by any known deposition method followed by a conventional patterning process.

Figure 4D:
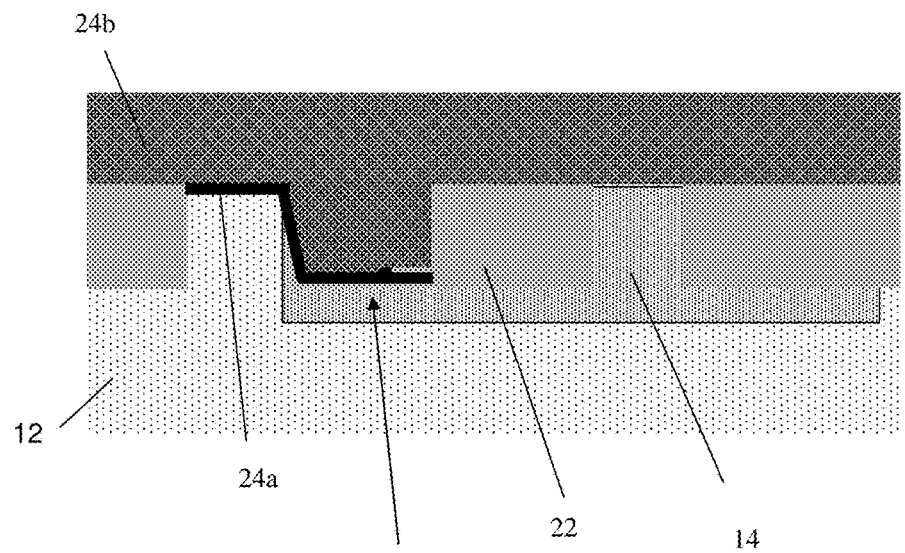
Figure 4E:
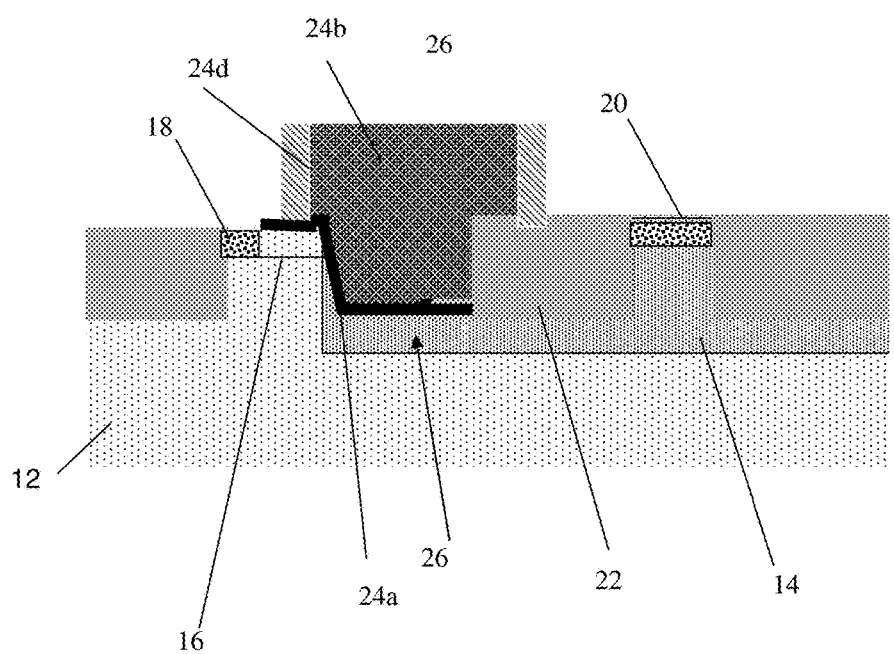

As further shown in FIG. 4D, a gate electrode material 24b may be formed over the structure including within the trench 26 and over the gate dielectric material 24a. In embodiments, the gate electrode material 24b may be a polysilicon material; although metal materials are also contemplated herein. In FIG. 4E, the gate electrode material 24b may be patterned using conventional lithography and etching processes. Following the formation of the gate electrode, a sidewall spacer 24d may be deposited by, e.g., CVD, and patterned on the gate electrode 24b as described with respect to FIG. 3E. The gate body 16, the drain region 18 and the source region 20 may be formed by conventional ion implantation processes as already described herein such that no further explanation is required for one of ordinary skill in the art to practice the invention.

The structures can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    a drift region within a semiconductor substrate;
    a body contact within the semiconductor substrate;
    a shallow trench isolation structure within the drift region and adjacent to the body contact; and
    a gate structure partly extending within the shallow trench isolation structure and outside of the shallow trench isolation structure on an upper surface of the body contact within the semiconductor substrate adjacent to the drift region.

2. The structure of claim 1, wherein the gate structure comprises a gate dielectric material that extends into a trench within the shallow trench isolation structure.

3. The structure of claim 2, wherein the trench extends partially within a depth of the shallow trench isolation structure.

4. The structure of claim 3, wherein the gate dielectric material extends onto a sidewall of the trench and the upper surface of the semiconductor substrate.

5. The structure of claim 2, wherein the trench in the shallow trench isolation structure exposes a surface of the drift region.

6. The structure of claim 5, wherein the gate dielectric material contacts a surface of the drift region at a bottom of the trench and a sidewall of the trench.

7. The structure of claim 6, wherein the gate dielectric material extends to a source region on a surface of the semiconductor substrate.

8. The structure of claim 1, wherein a channel region of the gate structure comprises a sloped channel region.

9. The structure of claim 8, wherein the channel region of the gate structure comprises a vertical channel region.

10. The structure of claim 1, wherein the channel region is a three dimensional channel region.

11. The structure of claim 1, further comprising diffusion regions on opposing sides of the gate structure, wherein a first diffusion region is within the drift region and a second diffusion region is adjacent to the gate structure and the drift region.

12. The structure of claim 1, further comprising diffusion regions on opposing sides of the gate structure, wherein a first diffusion region is separated from the gate structure by a shallow trench isolation structure and a second diffusion region is adjacent to the gate structure and the drift region.

13. A structure comprising:
    a semiconductor substrate comprising a drift region and diffusion regions;
    a body contact within the semiconductor substrate and adjacent to a first diffusion region of the diffusion regions;
    a shallow trench isolation structure within the drift region and adjacent to the body contact; and
    a gate structure partly extending within the shallow trench isolation structure and outside of the shallow trench isolation structure on an upper surface of the body contact within the semiconductor substrate, and further comprising a three dimensional channel region.

14. The structure of claim 13, wherein the gate structure comprises a gate dielectric material on a sidewall of a trench formed in the shallow trench isolation structure and extends to a surface of the semiconductor substrate adjacent to the drift region and one of the diffusion regions.

15. The structure of claim 14, wherein the gate dielectric material is on a bottom of the trench formed in the shallow trench isolation structure.

16. The structure of claim 15, wherein the gate dielectric material on the bottom of the trench contacts a surface of the drift region.

17. The structure of claim 14, wherein the three dimensional channel region comprises a sloped channel region.

18. The structure of claim 17, wherein the sloped channel region resides on a sidewall of the trench within the shallow trench isolation structure.

19. The structure of claim 13, wherein the diffusion regions comprise a source region and a drain region, the drain region and the three dimensional channel region being separated from the gate structure by a shallow trench isolation region.

20. A method comprises:
    forming a drift region within a semiconductor substrate;
    forming a body contact within the semiconductor substrate
    forming a shallow trench isolation structure within the drift region and adjacent to the body contact; and
    forming a gate structure partly extending within the shallow trench isolation structure and outside of the shallow trench isolation structure on an upper surface of the body contact within the semiconductor substrate adjacent to the drift region.

* * * * *